United States Patent
Tang et al.

(10) Patent No.: US 8,604,485 B2
(45) Date of Patent: Dec. 10, 2013

(54) INTERMEDIATE STRUCTURE, METHOD AND SUBSTRATE FOR FABRICATING FLEXIBLE DISPLAY DEVICE

(75) Inventors: Wen-Chung Tang, Hsinchu (TW); Fang-An Shu, Hsinchu (TW); Yao-Chou Tsai, Hsinchu (TW); Ted-Hong Shinn, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 0 days.

(21) Appl. No.: 13/571,477

(22) Filed: Aug. 10, 2012

(65) Prior Publication Data
US 2012/0300419 A1 Nov. 29, 2012

Related U.S. Application Data
(63) Continuation-in-part of application No. 12/556,692, filed on Sep. 10, 2009, now Pat. No. 8,268,655.

(30) Foreign Application Priority Data

Jul. 8, 2009 (TW) .............................. 98123118 A
Aug. 23, 2011 (TW) ............................. 100130109 A

(51) Int. Cl.
*H01L 27/14* (2006.01)

(52) U.S. Cl.
USPC ............................................. 257/72; 361/749

(58) Field of Classification Search
USPC ............................................................ 257/72
See application file for complete search history.

(56) References Cited

U.S. PATENT DOCUMENTS

| | | |
|---|---|---|
| 2002/0006248 A1 | 1/2002 | Makino et al. |
| 2005/0253273 A1* | 11/2005 | Tai et al. ........................ 257/774 |
| 2006/0238691 A1* | 10/2006 | Kawamura et al. ............ 349/150 |
| 2007/0091062 A1* | 4/2007 | French et al. .................. 345/107 |

* cited by examiner

*Primary Examiner* — Lex Malsawma
(74) *Attorney, Agent, or Firm* — Chun-Ming Shih

(57) ABSTRACT

An intermediate structure of a flexible display device includes a substrate, an etching layer, a flexible substrate, and a display module. A trench structure is formed in a surface of the substrate. The etching layer is formed on the surface and covers the substrate. The flexible substrate is disposed on the etching layer. The flexible substrate and the substrate are spaced apart from each other by the etching layer. The display module is disposed on the flexible substrate. The flexible substrate can be peeled from the substrate without applying a mechanical force and thus the yield is improved, and the process time and the fabricating cost are also reduced. In addition, the present invention also provides a substrate for fabricating a flexible display device and a method for fabricating a flexible display device.

8 Claims, 6 Drawing Sheets

INTERMEDIATE STRUCTURE, METHOD AND SUBSTRATE FOR FABRICATING FLEXIBLE DISPLAY DEVICE

CROSS-REFERENCE TO RELATED APPLICATIONS

This application is a continuation-in-part of U.S. patent application Ser. No. 12/556692 filed on Sep. 10, 2009 now U.S. Pat. No. 8,268,655, which is commonly assigned.

TECHNICAL FIELD

The present invention relates generally to a display device, and more particularly to an intermediate structure of a flexible display device, a method and a substrate for fabricating a flexible display device.

BACKGROUND

FIGS. 1 and 2 are schematic views of a known method for fabricating a flexible display device. Referring to FIG. 1, firstly, a flexible substrate 120 is formed on a glass substrate 110, and then an isolating layer 130, a display unit 140 are formed on the flexible substrate 120 sequentially. After that, as shown in FIG. 2, a laser releasing process is performed, and the flexible substrate 120 is peeled from the glass substrate 110.

However, the above method suffers from problems of high equipment cost and high material cost. Besides, a mechanical force applied to the flexible substrate 120 may damage elements on the flexible substrate 120 during the peeling process and thereby reducing the yield rate.

To overcome these problems, another method for fabricating a flexible display device is developed. As shown in FIG. 3, a low viscosity release layer 230 is disposed on a glass substrate 210, and then the release layer 230 is covered with a flexible substrate 220. After that, an isolating layer 240 and a display unit 250 are formed on the flexible substrate 220. Then, the flexible substrate 220 is cut along a scribe line L1.

Referring to FIG. 4, the flexible substrate 220, the isolating layer 240, and the display unit 250 are peeled from the glass substrate 210.

The release layer 230 decreases the peeling force required. However, the peeling force is still required in the peeling process for peeling the flexible substrate 220 from the glass substrate. The peeling force may also damage the elements on the flexible substrate and thereby reducing the yield rate. Moreover, additional time is required to clean residues 232 from the release layer 230 on a lower surface 222 of the flexible substrate, and thus the fabricating cost is also increased.

SUMMARY

The present invention provides an intermediate structure of a flexible display device. A flexible substrate of the intermediate structure can be peeled from a substrate without applying a mechanical force. Thus, the yield rate is improved, and the process time and fabricating cost are reduced.

The present invention also provides a method for fabricating a flexible display device. In the method, a flexible substrate can be peeled from a substrate without applying a mechanical force. Thus, the yield rate is improved, and the process time and fabricating cost are reduced.

The present invention yet provides a substrate for fabricating a flexible display device. In a method for fabricating a flexible display device using the substrate, a flexible substrate formed on the substrate can be peeled from the substrate without applying a mechanical force. Thus, the yield rate is improved, and the process time and fabricating cost are reduced.

In one embodiment, an intermediate structure of a flexible display device includes a substrate, an etching layer, a flexible substrate and a display module. The substrate has a surface defining a trench structure therein. The etching layer is formed on the surface and covering the trench structure. The flexible substrate is disposed on the etching layer and spaced apart from the substrate by the etching layer. The display module is disposed on the flexible substrate.

In another embodiment, a method for fabricating a flexible display device includes: forming a trench structure in a surface of a substrate; forming an etching layer on the surface to cover the trench structure; forming a flexible substrate on the etching layer that is spaced apart from the substrate by the etching layer; forming a display module on the flexible substrate; and removing the etching layer to separate the flexible substrate from the substrate.

In yet another embodiment, a substrate for fabricating a flexible display device is provided and a surface of the substrate defines a trench structure therein.

In the above described method for fabricating a flexible display device or intermediate structure of a flexible display device, the etching process is used to remove the etching layer thereby separating the flexible substrate from the substrate. Thus, no additional mechanical force is required to peel the flexible substrate from the substrate. Accordingly, damage to display module or other elements on the flexible substrate can be avoided during the separating process and the yield rate is improved. In addition, there are not residues left on the flexible substrate after the separating process. Therefore, the cleaning process of the residues is also not necessary, and thus the process time and the fabricating cost are also reduced.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
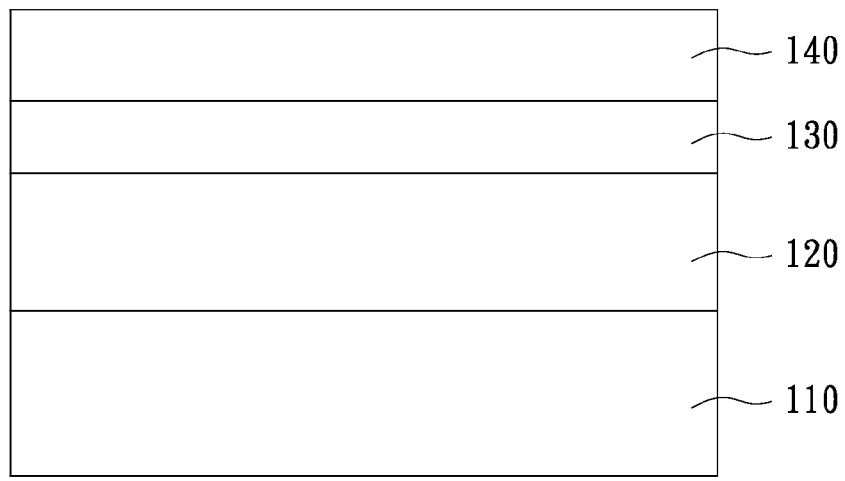
FIGS. 1 and 2 are schematic views of a known method for fabricating a flexible display device.
Figure 2:
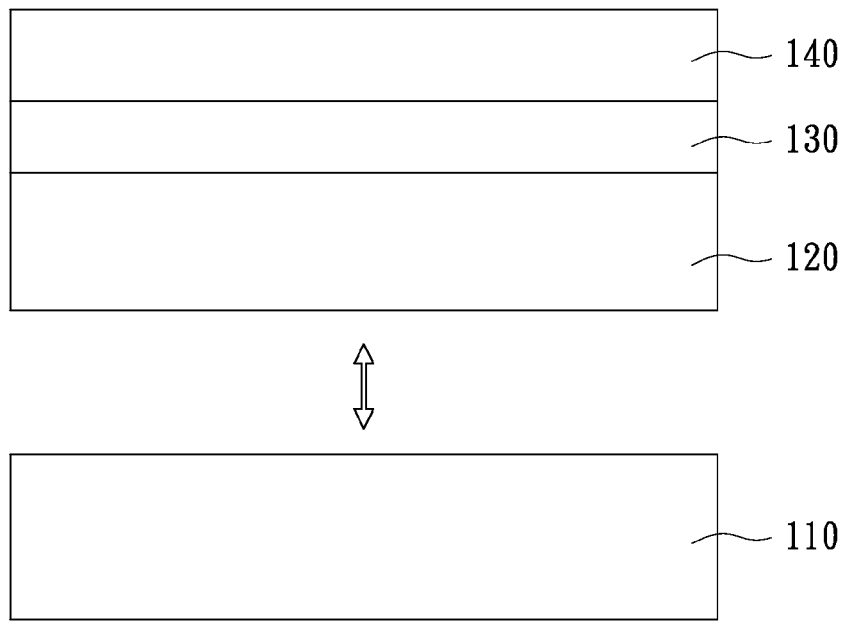
Figure 3:
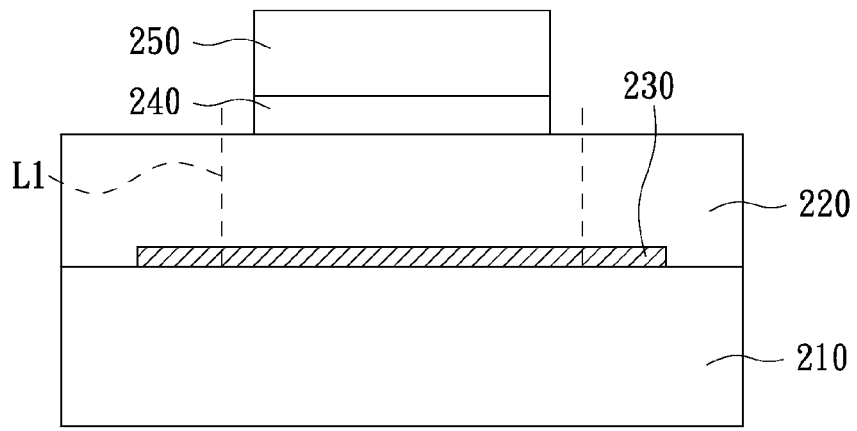
FIGS. 3 and 4 are schematic views of another known method for fabricating a flexible display device.
Figure 4:
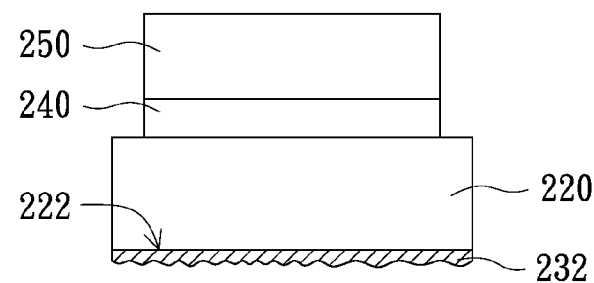
Figure 4:
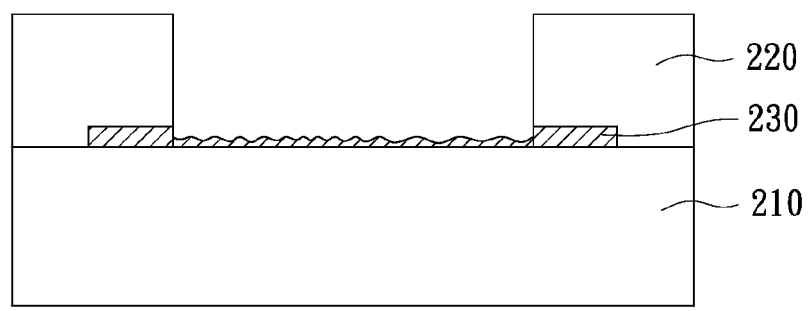
Figure 5A:
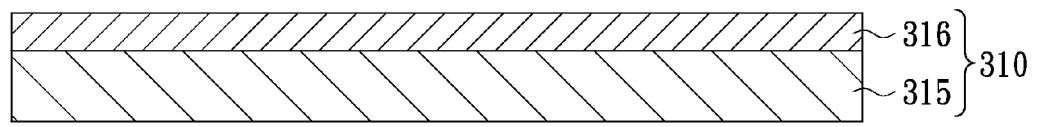
FIGS. 5A to 5H are schematic views illustrating a method for fabricating a flexible display device in accordance with an embodiment.
Figure 5B:
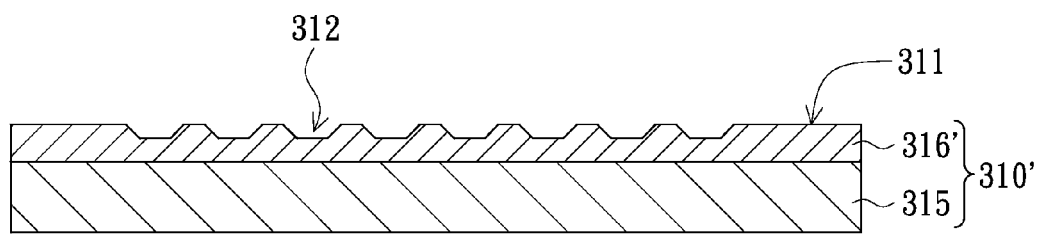
Figure 5C:
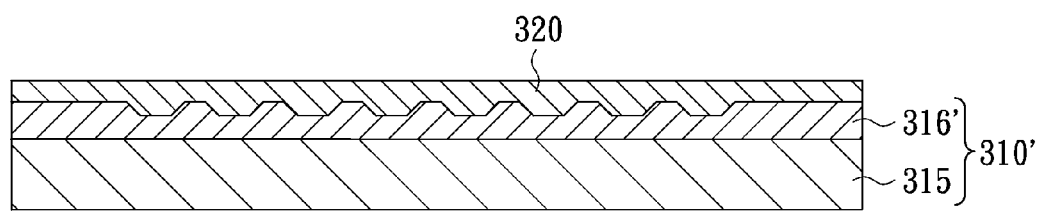
Figure 5D:
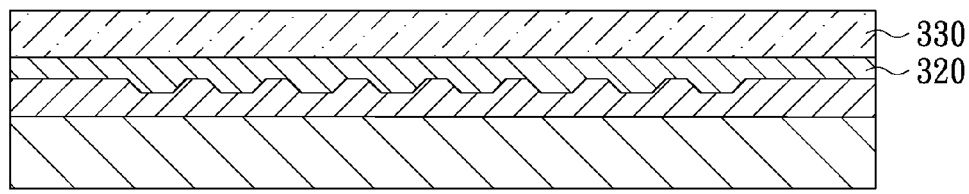
Figure 5E:
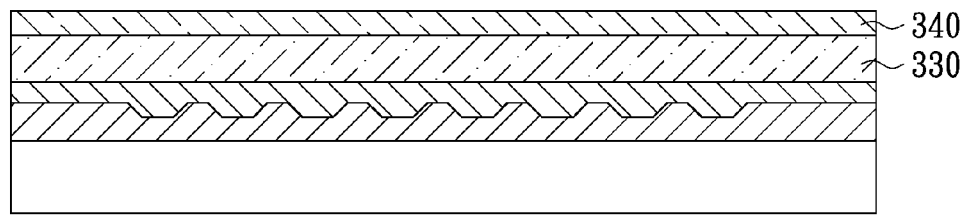
Figure 5F:
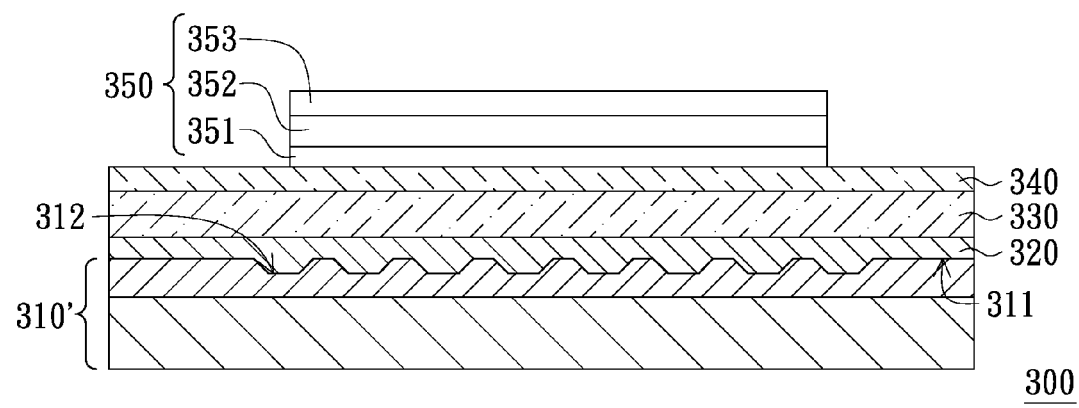
Figure 5G:
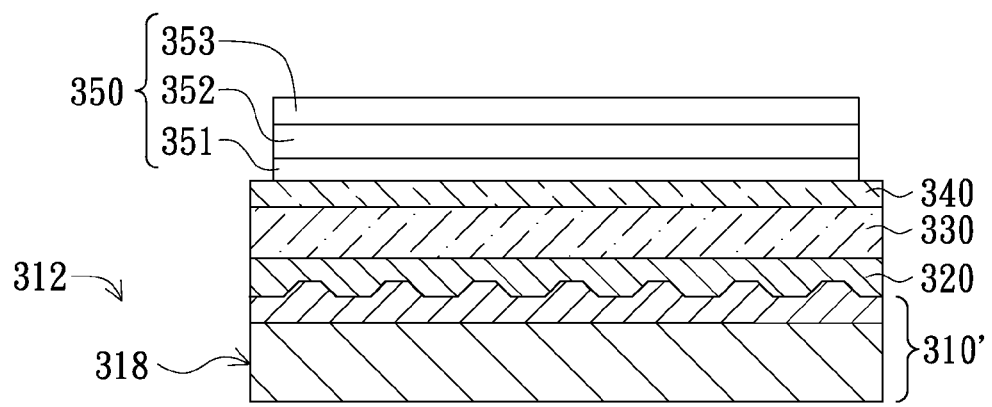
Figure 5H:
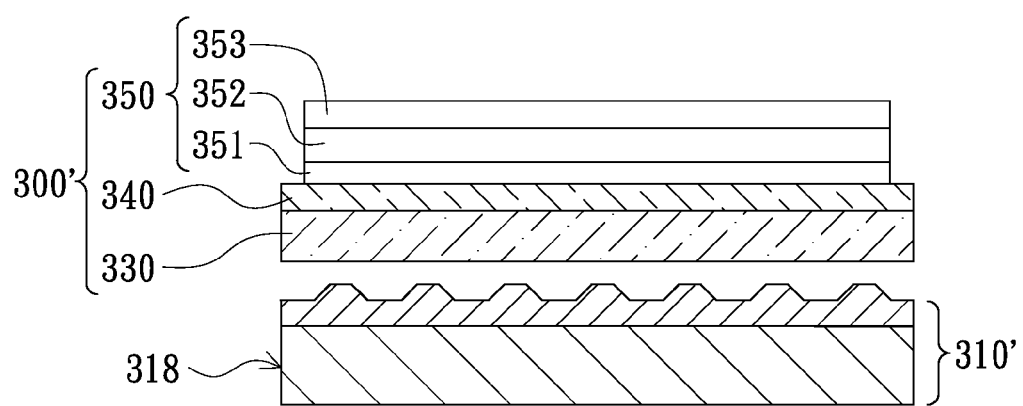
Figure 6:
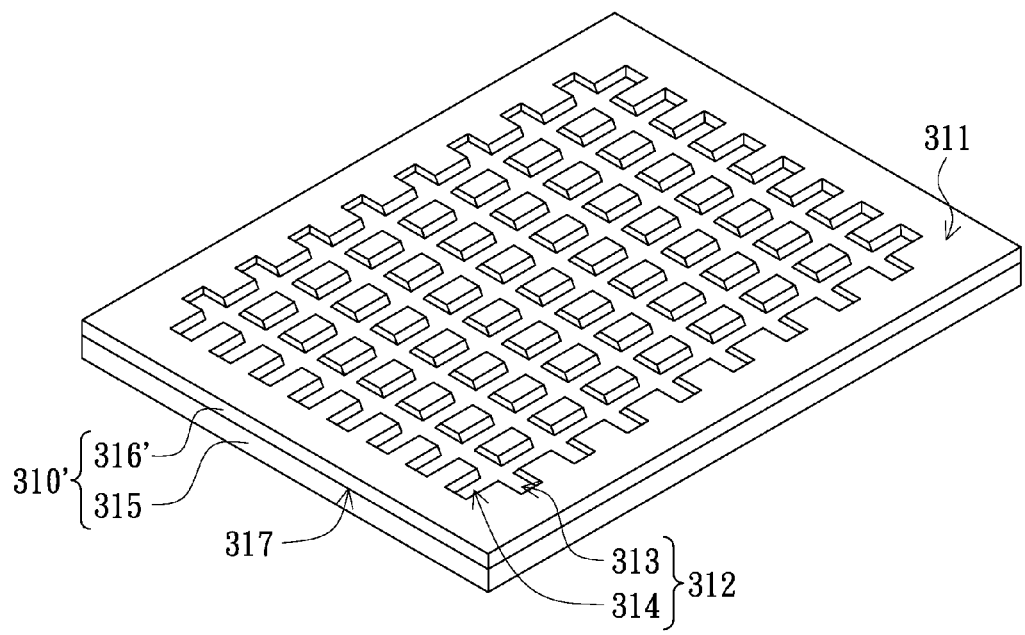
FIG. 6 is a perspective view of a substrate for fabricating a flexible display device shown in FIG. 5B.

FIGS. 5A to 5H illustrates a method for fabricating a flexible display device in accordance with an embodiment, and FIG. 6 is a perspective view of a substrate shown in FIG. 5B. The method for fabricating a flexible display device in accordance with the present embodiment includes following steps. Referring to FIG. 5A, firstly, a substrate 310 is provided. The substrate 310 is, for example but not limited to, a rigid substrate such as a glass substrate. Any suitable material that meets the required properties in the fabricating process such as strength, stability to the temperature shock and resistance to the etchant can be used to form the substrate 310. In the present embodiment, the substrate 3310 is a multilayer substrate, which includes a bottom plate 315 and an upper layer 316 formed on the bottom plate 315. The bottom plate 315 is, for example, a glass plate, and the upper layer 316 is, for example, a photoresist layer.

Figure 7:
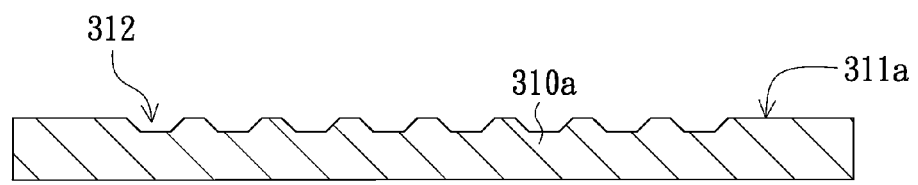
FIG. 7 is a schematic view of a substrate for fabricating a flexible display device in accordance with another embodiment.

In succession, as shown in FIGS. 5B and 6, a trench structure 312 is formed in a surface 311 of the substrate 310. In detail, the surface 311 is, for example, a surface of the upper layer 316, and the trench structure 312 is formed by patterning the upper layer 316 in FIG. 5A thereby obtaining a patterned upper layer 316' with the trench structure 312 formed therein. The numeral 310' is used in the context to represent the substrate having the trench structure 312 formed therein. The patterning process for the upper layer 316 depends on the material thereof In the present embodiment, the upper layer 316 consists of a photoresist, and a lithography process is used to pattern the upper layer 316. As shown in FIG. 7, in another embodiment, a substrate 310a is a single layer substrate (e.g., glass plate or other rigid substrate), and the trench structure 312 is directly formed in a surface 311a of the substrate 310a. An etching process may be employed to pattern the surface 311a thereby forming the trench structure 312.

Referring again to FIG. 6, the trench structure 312, for example, includes a number of first trenches 313 and a number of second trenches 314. The first trenches 313 are parallel to each other, and the second trenches 314 are also parallel to each other. Besides, the first trenches 313 intersect with the second trenches 314 thereby forming the grid like trench structure 312. In the present embodiment, the first trenches 31 are, for example, perpendicular to the second trenches 314. In addition, the trench structure 312 is not exposed from (i.e. beneath) side surfaces 317 of the substrate 310. The above described arrangement of the trench structure 312 is taken as an example, and the present invention is not limited to this configuration.

Referring to FIG. 5C, after forming the trench structure 312, an etching layer 320 is formed on the substrate 310'. The etching layer 320 covers and fills up the trench structure 312. The etching layer 320 consists of, for example but not limited to, silicon, molybdenum, titanium, or tungsten. The etching layer 320 may be formed by a physical deposition method such as evaporation or sputtering.

Referring to FIG. 5D, after forming the etching layer 320, a flexible substrate 330 is formed on the etching layer 320. The flexible substrate 330 consists of, for example, polyimide. The flexible substrate 330 may be laminated on an upper surface of the etching layer 320.

Then, as shown in FIG. 5E, an isolating layer 340 is formed on the flexible substrate 330. The isolating layer 340 consists of dielectric inorganic materials or polymers. Examples of the inorganic materials include silicon nitride, silicon oxide, and silicon oxynitride. Examples of the polymers include polyimide, polycarbonate or any other suitable plastics. In addition, it is to be noted that the isolating layer 340 may also be omitted. Thus, the present step may also be omitted.

Referring to FIG. 5F, after forming the isolating layer 340, a display module 350 is formed on the isolating layer 340.

Thus, the isolating layer 340 is disposed between the flexible substrate 330 and the display module 350. In addition, if the isolating layer 340 is not formed, the display module 350 is directly formed on the flexible substrate 330. The display module 350, for example, includes a driving circuit layer 351, a display medium layer 352 and a protective layer 353. The driving circuit layer 351 is disposed on the isolating layer 340, the display medium layer 352 is disposed on the driving circuit layer 351, and the protective layer 353 is disposed on the display medium layer 352. The driving circuit layer 351, for example, includes a thin film transistor array, relating signal wires and auxiliary circuits. The display medium layer 352 is, for example, a liquid crystal display layer, an electrophoretic display layer or other display layers. The protective layer 353 consists of, for example, a transparent material such as glass or transparent plastics. It is to be noted that the above configuration of the display module 350 is only an example, and any other display modules can be used in the present embodiment.

An intermediate structure 300 of a flexible display device is obtained after forming the display module 350. The intermediate structure 300 includes the substrate 310', the etching layer 320, the flexible substrate 330, the isolating layer 340 and the display module 350. The surface 311 of the substrate 310' defines the trench structure 312. The etching layer 320 is formed on the surface 11 of the substrate 310' and covers the trench structure 312. The flexible substrate 330 is disposed on the etching layer 320. The flexible substrate 330 and the substrate 310' are spaced apart from each other by the etching layer 320. The display module 350 is disposed on the isolating layer 340. In addition, if the isolating layer 340 is omitted, the display module 350 is directly formed on the flexible substrate 330.

The method for fabricating a flexible display device further includes a step of separating the flexible substrate 330 from the substrate 310'. As shown in FIG. 5G, after finishing the display module 350, the substrate 310', and the etching layer 320, the flexible substrate 330, the isolating layer 340 formed on the substrate 310' are cut to exposed the trench structure 312 from at least one side surface 318 of the substrate 310. The side surface 318 is defined by the cutting process. In the present embodiment, the number of the side surface 318 is two or more. However, in another embodiment, there is only one side surface 318 is formed after the cutting process. In addition, the trench structure 312 can be formed to be exposed from the side surfaces 317 during the pattering process for defining the trench structure 312. On this condition, the cutting process for exposing the trench structure 312 from the side surface 318 is not necessary.

Referring to FIG. 5H, after finishing the cutting process, the etching layer 320 is removed to separate the flexible substrate 330 and the substrate 310'. In detail, the etching layer 320 can be removed with an etching process such as a dry etching process or a wet etching process. An etchant gas used in the dry etching process depends on the material of the etching layer 320. In one embodiment, xenon difluoride is used to etch the etching layer 320. Since the side surface 318 exposes the trench structure, the etchant gas reacts with the etching layer 320 in the trench structure 312 and thereby gradually removing the etching layer 320. After finishing this etching process, the flexible substrate 330 is separated from the substrate 310' thereby obtaining an intermediate structure 300', which includes the flexible substrate 330, the isolating layer 340 and the display module 350.

In the above described method for fabricating a flexible display device, the etching process is used to remove the etching layer 320 thereby peeling the flexible substrate 330 from the substrate 310'. Thus, no additional mechanical force is required to peel the flexible substrate 330 from the substrate 310'. Accordingly, damage to the display module 350 or other elements on the flexible substrate 330 can be avoided during the peeling process and the yield rate is improved. In addition, there are not residues left on the flexible substrate after the separating process. Therefore, the cleaning process of the residues is also not necessary, and thus the process time and the fabricating cost are also reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An intermediate structure of a flexible display device, comprising:
   a substrate, comprising a surface defining a trench structure therein;
   an etching layer formed on the surface and covering the trench structure;
   a flexible substrate, disposed on the etching layer and spaced apart from the substrate by the etching layer; and
   a display module, disposed on the flexible substrate.

2. The intermediate structure of a flexible display device as claimed in claim 1, wherein the etching layer consists of silicon, molybdenum, titanium, or tungsten.

3. The intermediate structure of a flexible display device as claimed in claim 1, further comprising an isolating layer, disposed between the flexible substrate and the display module.

4. The intermediate structure of a flexible display device as claimed in claim 1, wherein the display module comprises:
   a driving circuit layer, disposed on the isolating layer;
   a display medium layer, disposed on the driving circuit layer; and
   a protective layer, disposed on the display medium layer.

5. The intermediate structure of a flexible display device as claimed in claim 1, wherein the substrate is a rigid substrate.

6. The intermediate structure of a flexible display device as claimed in claim 1, wherein the trench structure comprises a plurality of first trenches and a plurality of second trenches intersected with the first trenches.

7. The intermediate structure of a flexible display device as claimed in claim 1, wherein the substrate comprises a bottom plate and a patterned upper layer, and the surface defining the trench structure is a surface of the patterned upper layer.

8. A substrate for fabricating a flexible display device, wherein the substrate comprises a bottom plate and a patterned upper layer formed on the bottom plate, a surface of the patterned upper layer defines a trench structure therein, the bottom plate is not exposed from the trench structure, and the trench structure comprises a plurality of first trenches and a plurality of second trenches intersected with the first trenches.

* * * * *